(12) United States Patent
Larsen et al.

(10) Patent No.: US 9,088,303 B2
(45) Date of Patent: Jul. 21, 2015

(54) CODEWORDS THAT SPAN PAGES OF MEMORY

(71) Applicant: Micron Technology, Inc., Boise, ID (US)

(72) Inventors: Troy D. Larsen, Meridian, ID (US); Martin L. Culley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 13/780,726

(22) Filed: Feb. 28, 2013

(65) Prior Publication Data

US 2014/0245097 A1 Aug. 28, 2014

(51) Int. Cl.
*G11C 29/00* (2006.01)
*H03M 13/29* (2006.01)
*H03M 13/09* (2006.01)
*H03M 13/11* (2006.01)
*H03M 13/15* (2006.01)

(52) U.S. Cl.
CPC .......... *H03M 13/2906* (2013.01); *H03M 13/09* (2013.01); *H03M 13/1102* (2013.01); *H03M 13/152* (2013.01); *H03M 13/1515* (2013.01)

(58) Field of Classification Search
CPC ............ G06F 12/1063; G06F 12/1009; G06F 12/145; G06F 11/1044; G06F 11/1068
USPC .................. 711/103, E12.001, E12.008, 206; 718/1; 714/755, 786, 782, 758, 784
See application file for complete search history.

(56) References Cited

U.S. PATENT DOCUMENTS

| | | | |
|---|---|---|---|
| 6,981,198 B2 | 12/2005 | Boyer et al. | |
| 8,196,020 B2 | 6/2012 | Lee et al. | |
| 2005/0240721 A1* | 10/2005 | Lasser | 711/103 |
| 2011/0296272 A1 | 12/2011 | Rub et al. | |
| 2011/0320915 A1 | 12/2011 | Khan | |
| 2012/0054476 A1 | 3/2012 | Duda et al. | |
| 2013/0024748 A1* | 1/2013 | Sharon et al. | 714/773 |
| 2013/0205183 A1* | 8/2013 | Fillingim et al. | 714/773 |

* cited by examiner

*Primary Examiner* — Guy Lamarre
(74) *Attorney, Agent, or Firm* — Brooks, Cameron & Huebsch, PLLC

(57) ABSTRACT

The present disclosure includes apparatuses and methods for codewords that span pages of memory. A number of methods include writing a first portion of a primary codeword to a first page in a first block of memory and writing a second portion of the primary codeword to a second page in a second block of memory. The primary codeword can be included in a secondary codeword. The method can include writing a first portion of the secondary codeword in the memory and writing a second portion of the secondary codeword to a different page and block of the memory than the first portion of the secondary codeword.

35 Claims, 4 Drawing Sheets

CODEWORDS THAT SPAN PAGES OF MEMORY

TECHNICAL FIELD

The present disclosure relates generally to semiconductor memory and methods, and more particularly, to apparatuses and methods for codewords that span pages of memory.

BACKGROUND

Memory devices are typically provided as internal, semiconductor, integrated circuits in computers or other electronic devices. There are many different types of memory including volatile and non-volatile memory. Volatile memory can require power to maintain its data (e.g., user data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and/or NOR flash memory), and/ or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

DETAILED DESCRIPTION

Figure 1:
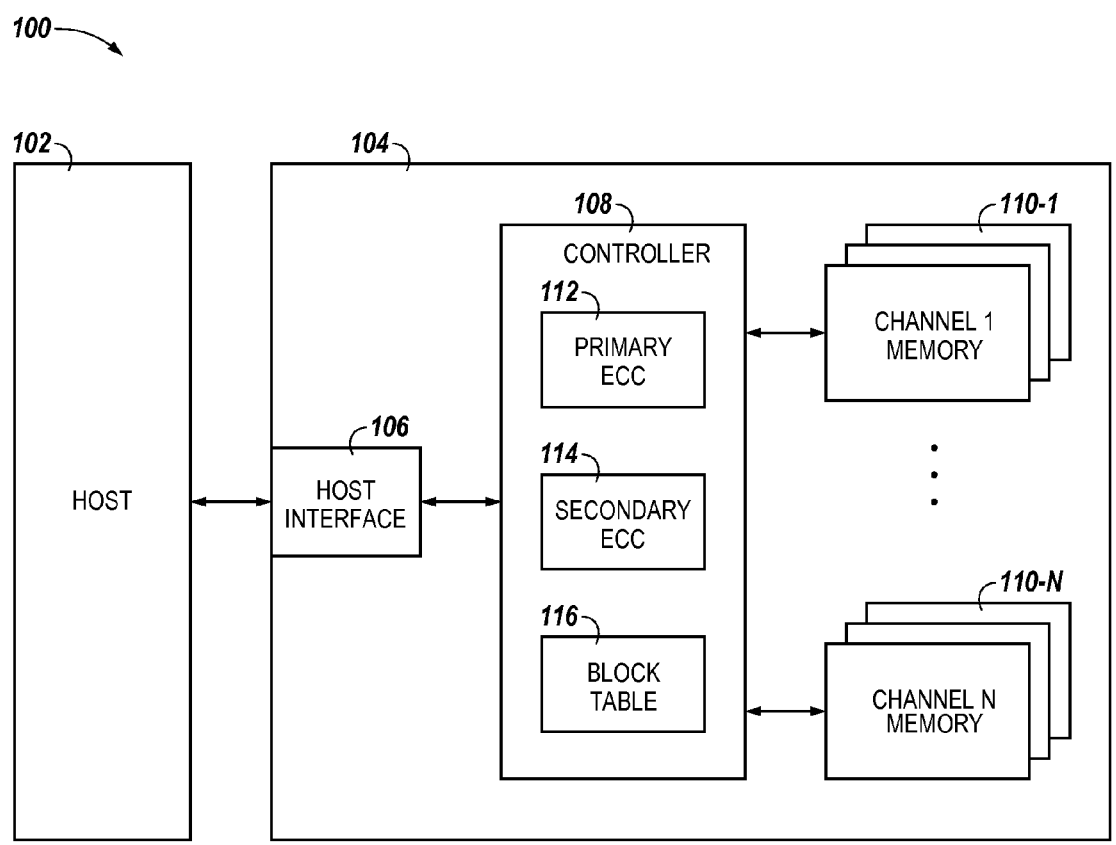
FIG. 1 illustrates a block diagram of an apparatus in the form of a computing system including at least one memory system in accordance with a number of embodiments of the present disclosure.

Some previous approaches may include pages of memory that are sized such that codewords that include user data, error data (e.g., error control coding (ECC) check bits), and/or meta data can be contained on a single physical page. However, circumstances can dictate that the user data and/or meta data to be protected by ECC, the code rate of the ECC scheme, or a combination of such requires more data than can be stored in the targeted physical page. Thus, according to the present disclosure, a codeword can span more than one physical page of memory (e.g., span at least two physical pages on a single die or span at least two physical pages on multiple dice).

The present disclosure includes apparatuses and methods for codewords that span pages of memory. A number of methods include writing a first portion of a primary codeword to a first page in a first block of memory and writing a second portion of the primary codeword to a second page in a second block of memory. The primary codeword can be included in a secondary codeword. The method can include writing a first portion of the secondary codeword in the memory and writing a second portion of the secondary codeword to a different page and block of the memory than the first portion of the secondary codeword.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B", "N", and "P", particularly with respect to reference numerals in the drawings, indicates that a number of the particular feature so designated can be included. As used herein, "a number of" a particular thing can refer to one or more of such things (e.g., a number of memory devices can refer to one or more memory devices). As used herein, the terms "first," "second," "third," and "fourth" are used to differentiate between one feature from another and do not necessarily imply an order between the features so designated. For example, "a first primary codeword" does not necessarily imply that that the first primary codeword came before "a second primary codeword."

The figures herein follow a numbering convention in which the first digit or digits correspond to the drawing figure number and the remaining digits identify an element or component in the drawing. Similar elements or components between different figures may be identified by the use of similar digits. For example, 330 may reference element "30" in FIG. 3, and a similar element may be referenced as 430 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as NAND flash devices), which provide a storage volume for the memory system 104.

As illustrated in FIG. 1, the controller 108 can be coupled to the host interface 106 and to the memory devices 110-1, . . . , 110-N via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106. In some embodiments, the interface 106 can be a component of and/or integrated with the controller 108.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory devices 110-1, . . . , 110-N to control data read, write, and erase operations, among other operations. Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., one or more integrated circuits) and/or software for controlling access to the number of memory devices 110-1, . . . , 110-N and/or for facilitating data transfer between the host 102 and memory devices 110-1, . . . , 110-N.

The memory devices 110-1, . . . , 110-N can include a number of arrays of memory cells (e.g., non-volatile memory cells). The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. Additional detail of a memory architecture is illustrated and described with respect to FIG. 2.

In operation, data can be written to and/or read from a memory device of a memory system (e.g., memory devices 110-1, . . . , 110-N of system 104) as a physical page of data, for example. As such, a physical page of data can be referred to as a data transfer size of the memory system. Data can be transferred to/from a host (e.g., host 102) in data segments referred to as sectors (e.g., host sectors). As such, a sector of data can be referred to as a data transfer size of the host. A plurality of sectors can constitute a logical page of data.

Although a physical page of data can include a number of bytes of user data (e.g., a data payload including a number of sectors of data) as well as metadata corresponding thereto, a size of a physical page of data often can refer only to the number of bytes of the user data. As an example, a physical page of data having a page size of 4 KB may include 4 KB of user data (e.g., a 4 KB logical page of data) as well as a number of bytes (e.g., 32B, 54B, 224B, etc.) of metadata corresponding to the user data. The metadata can include error data (e.g., error detecting and/or correcting code data) and/or address data (e.g., logical address data), among other metadata corresponding to the user data.

In some embodiments, and as illustrated in FIG. 1, the controller 108 can include a primary error control coding (ECC) component 112, a secondary ECC component 114, and a block table 116. Each of the primary ECC component 112, the secondary ECC component 114, and the block table 116 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the primary ECC component 112, the secondary ECC component 114, and the block table 116 can be external to the controller 108 or have a number of components located within the controller 108 and a number of components located external to the controller 108. For example, the block table 116 can be stored in memory within the controller 108, in memory external to the controller 108 and separate from the number of memory devices 110-1, . . . , 110-N, and/or in a number of the memory devices 110-1, . . . , 110-N.

The primary ECC component 112 can be configured to error code data as a plurality of primary codewords. A primary codeword can have a total size that includes a wrapper and a payload. The primary codeword payload can refer to the data (e.g., user data) that is encoded within the codeword. The codeword wrapper can refer to the error data that is encoded in the codeword along with the payload to protect the payload. The ratio of codeword payload size to total codeword size is referred to herein as a code rate. The primary codewords can include user data and error data that is associated exclusively therewith (as opposed to being associated with more than one primary codeword or being associated with a different primary codeword). In some embodiments, the primary ECC component 112 can be configured to error code data with a fixed primary codeword size. Where the number of memory devices 110-1, . . . , 110-N have a fixed physical page size, the fixed physical page size may not be evenly divisible by the fixed primary codeword size. The controller 108 can be configured to write a plurality of primary codewords to a plurality of pages of memory such that a subset of the plurality of primary codewords each span at least two of the plurality of pages of memory. The controller 108 can be configured to write a non-integer number of primary codewords to each of a plurality of first pages of memory (e.g., in each of a first plurality of blocks of memory) and to write a non-integer number of primary codewords to each of a plurality of second pages of memory (e.g., in each of a second plurality of blocks of memory) such that the non-integer number of primary codewords written to a respective first page of memory plus the non-integer number of primary codewords written to a respective second page of memory comprises an integer number of primary codewords collectively.

The secondary ECC component 114 can be configured to error code a plurality of primary codewords and error data therefor as a secondary codeword. In some embodiments, the secondary ECC component 114 can be configured to error code primary codewords with a fixed secondary codeword size. Where the number of memory devices 110-1, . . . , 110-N have a fixed physical page size, the fixed physical page size may not be evenly divisible by the fixed secondary codeword size. The controller 108 can be configured to write a non-integer number of primary and/or secondary codewords to a third page of memory and to write a non-integer number of primary and/or secondary codewords to a fourth page of memory such that the non-integer number of primary and/or secondary codewords written to the third page of memory plus the non-integer number of primary and/or secondary codewords written to the fourth page of memory comprise an integer number of primary and/or secondary codewords. Secondary codewords can be based on collections of primary codewords, individual primary codewords, or portions of primary codewords. For example, each of the secondary codewords can be based on a respective one of the group including: a first primary codeword from each of the plurality of first pages of memory, a second primary codeword from each of the plurality of second pages of memory, and a portion of a third codeword from each of the plurality of first pages of memory and a portion of the third primary codeword from each of the plurality of second pages of memory (e.g., where the codeword spans pages of memory).

The secondary ECC component 114 can error code a primary codeword as a secondary codeword by mirroring the primary codeword such that the secondary codeword comprises a mirror of the primary codeword. The secondary ECC component 114 can calculate error data (e.g., parity data) for a plurality of primary codewords. In such embodiments, the secondary codeword can be made up of the plurality of primary codewords and the error data, as described herein.

The terms "primary" and "secondary" as used herein with respect to ECC do not indicate levels of importance (e.g., where primary might otherwise indicate a greater importance than secondary). Rather, the terms "primary" and "secondary" indicate different types of ECC. The primary ECC component 112 can code a payload (e.g., user data) as a primary codeword that includes a wrapper (e.g., error data) to protect the payload. For example, the primary ECC component 112 can provide one or more of cyclic redundancy check (CRC) coding, Bose-Chaudhuri-Hocquenghem (BCH) coding and low density parity check (LDPC) coding, among other types of error coding. The secondary ECC component 114 can code collections of primary codewords and/or collections of portions of primary codewords and error data therefor as secondary codewords. The payloads of the error data codewords of the secondary codewords can include error data that protects the primary codewords and can allow a particular primary codeword or multiple primary codewords to be recovered based on other primary codewords protected by a particular secondary codeword and the error data for the secondary codeword. For example, the secondary ECC component 114 can perform an exclusive or (XOR) operation on a number of primary codewords such as in a redundant array of independent nodes (RAIN) operation or can provide Reed-Solomon error coding of a number of primary codewords, among other types of error coding, to yield an error data for the secondary codeword.

RAIN is one example of an implementation of secondary codewords according to the present disclosure. In general, RAIN is an umbrella term for data storage schemes that divide and/or replicate (e.g., mirror) data among multiple memory devices, for instance. The multiple memory devices in a RAIN array may appear to a user and the operating system of a computer as a single memory device (e.g., disk). RAIN can include striping (e.g., splitting) data so that different portions of the data are stored on different memory devices (e.g., memory devices 110, . . . , 110-N). The portions of the more than one device that store the split data are collectively referred to as a stripe. In contrast, RAIN can also include mirroring, which can include storing duplicate copies of data on more than one device. As an example of the former, write data can be striped across N-1 of N memory devices, where error data can be stored in an Nth memory device. Error data (e.g., parity data) can be calculated by the secondary ECC component 114 (e.g., by XOR circuitry) and written to the Nth memory device. The secondary ECC component 114 can employ a flexible stripe length (e.g., to account for bad blocks). The secondary ECC component 114 can be configured to write and/or read data in stripes across a plurality of memory devices 110-1, . . . , 110-N. For example, the controller 108 can be configured to read a stripe of data from a plurality of physical pages of memory, where each of the plurality of physical pages of memory stores a respective plurality of codewords. The controller 108 can be configured to combine payload portions of more than one of the respective plurality of codewords from one of the plurality of physical pages of memory to form a logical page of data. The logical page of data can then be transferred to a host (e.g., as a number of sectors, however embodiments are not so limited). In some embodiments, the secondary ECC component 114 can be configured to mirror collections of primary codewords (or portions thereof) as secondary codewords. In such embodiments, the mirrored codewords can comprise the error data (e.g., redundant data) of the secondary codeword (e.g., where the secondary codeword is the collection of primary codewords and the mirrored codewords).

The block table 116 can store data for blocks of memory in the number of memory devices 110-1, . . . , 110-N. Data stored in the block table 116 can include valid page data, erase count, and other health and/or status data. The controller 108 can be configured to maintain the block table 116 to include an indication of whether each block of memory is a bad block of memory. For example, a number of bad blocks can be indicated in the block table 116 as a result of those blocks failing a test of blocks in the number of memory devices 110-1, . . . , 110-N. Data accessed from the block table 116 can be indexed by physical block address. The controller 108 can be configured to update the health and status data for a particular block in the block table 116, e.g., in response to a write, an erase, or an error event for the particular block.

The controller 108 can be configured to maintain a correspondence between first pages of memory and second pages of memory in each of a plurality of pairs of blocks of memory. In some embodiments, each block of memory of a particular pair of blocks of memory can be on a different memory die. Each of the plurality of pairs of blocks of memory can include a first block of memory that includes a respective first page of memory and a second block of memory that includes a respective second page of memory. The controller 108 can be configured to write a non-integer number of codewords to each of the first pages of memory and the second pages of memory such that an integer number of codewords is written to a respective first page of memory and a respective second page of memory collectively. However, the controller 108 can be configured not to write a codeword to a particular first page of memory that is in an indicated good block of memory (e.g., as indicated by the block table 116) in response to a corresponding second page of memory being in an indicated bad block of memory (e.g., as indicated by the block table 116). Although such embodiments may not fully utilize an available capacity of the memory devices 110-1, . . . , 110-N, maintaining the correspondence between first and second pages of memory (rather than breaking the correspondence to account for bad blocks) can reduce a complexity of the controller 108 that would otherwise be required. Furthermore, as described herein, more fully utilizing the space provided by physical pages of memory (e.g., by spanning codewords) may more than account for not fully utilizing an available capacity of the memory devices 110-1, . . . , 110-N that may result from not writing in an indicated good first block of memory in response to a corresponding second block of memory being indicated as a bad block of memory.

The controller 108 can be configured to write the codeword to the particular first page of memory in response to the corresponding second page of memory being in an indicated good block of memory. In a number of embodiments, the controller 108 can be configured to write a first portion of the codeword to the particular first page of memory and a second portion of the codeword to the corresponding second page of memory in response to the first page being in an indicated good block of memory and in response to the corresponding second page of memory being in an indicated good block of memory. For example, the codeword can be a primary codeword and the controller 108 can be configured to write a plurality of primary codewords each to a respective first and corresponding second page of memory. The controller 108 can be configured to error code the plurality of primary codewords as a secondary codeword and write error data associated with the secondary codeword to a portion of a third page of memory and a portion of a fourth page of memory. The third and fourth pages of memory can be corresponding pages of memory, where the correspondence is maintained by the controller 108 analogously to the correspondence maintained for first and second pages of memory. The controller 108 can be configured to recover one of the plurality of primary codewords that is subject to an uncorrectable error (e.g., an error that cannot be corrected using the error data stored in the wrapper of the primary codeword). The recovery can be based on a remainder of the plurality of codewords and the error data associated with the secondary codeword as described in more detail herein.

Figure 2:
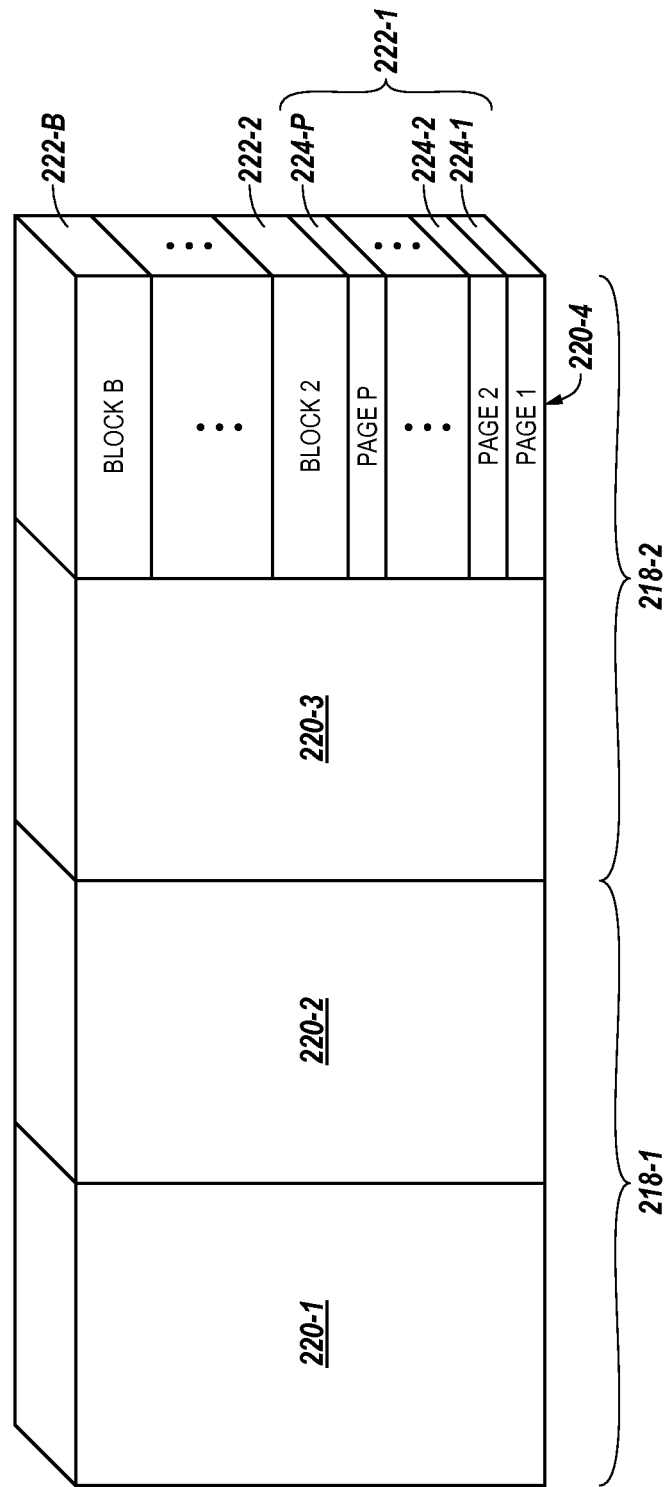
FIG. 2 illustrates a block diagram of a memory architecture in accordance with a number of embodiments of the present disclosure.

FIG. 2 illustrates a block diagram of a memory architecture in accordance with a number of embodiments of the present disclosure. FIG. 2 includes two memory dice 218-1 and 218-2 with two planes of memory each, 220-1, 220-2, 220-3, and 220-4. Each plane of memory includes a number of blocks of memory 222-1, 222-2, . . . , 222-B. As described herein, a block of memory cells can be erased together in one erase operation. Each block of memory includes a number of pages of memory (e.g., pages 224-1, 224-2, . . . , 224-P, included in block 1, 222-1). As described herein, a page of memory cells can be written or read together in one write or read operation.

Plane 220-1 can represent half of the blocks of memory on memory die 218-1, while plane 220-2 can represent the other half. Plane 220-3 can represent half of the blocks of memory on memory die 218-2, while plane 220-4 can represent the other half. In one or more embodiments, planes can be divided between odd and even numbered blocks of memory. In one or more embodiments, an "odd" or "even" block of memory can be a logical representation of data where data units from half (the "odd" numbered) of the memory cells coupled to access lines associated with the block of memory are stored in an "odd" block of memory and data units from the other half (the "even" numbered) of the memory cells coupled to access lines associated with the block of memory are stored in an "even" block of memory. Embodiments are not limited to a particular plane of memory representing half of the blocks of memory on a given die having more than one plane of memory; other distributions of blocks of memory between planes of memory are possible. Nor are embodiments limited to memory devices with a particular number of blocks of memory, planes of memory, or memory dice. According to a number of embodiments of the present disclosure, a single codeword can be written to span more than one page 224-1, 224-2, . . . , 224-P, more than one block 222-1, 222-2, . . . , 222-B, more than one plane 220-1, 220-2, 220-3, 220-4, and/or more than one die 218-1, 218-2.

Figure 3:
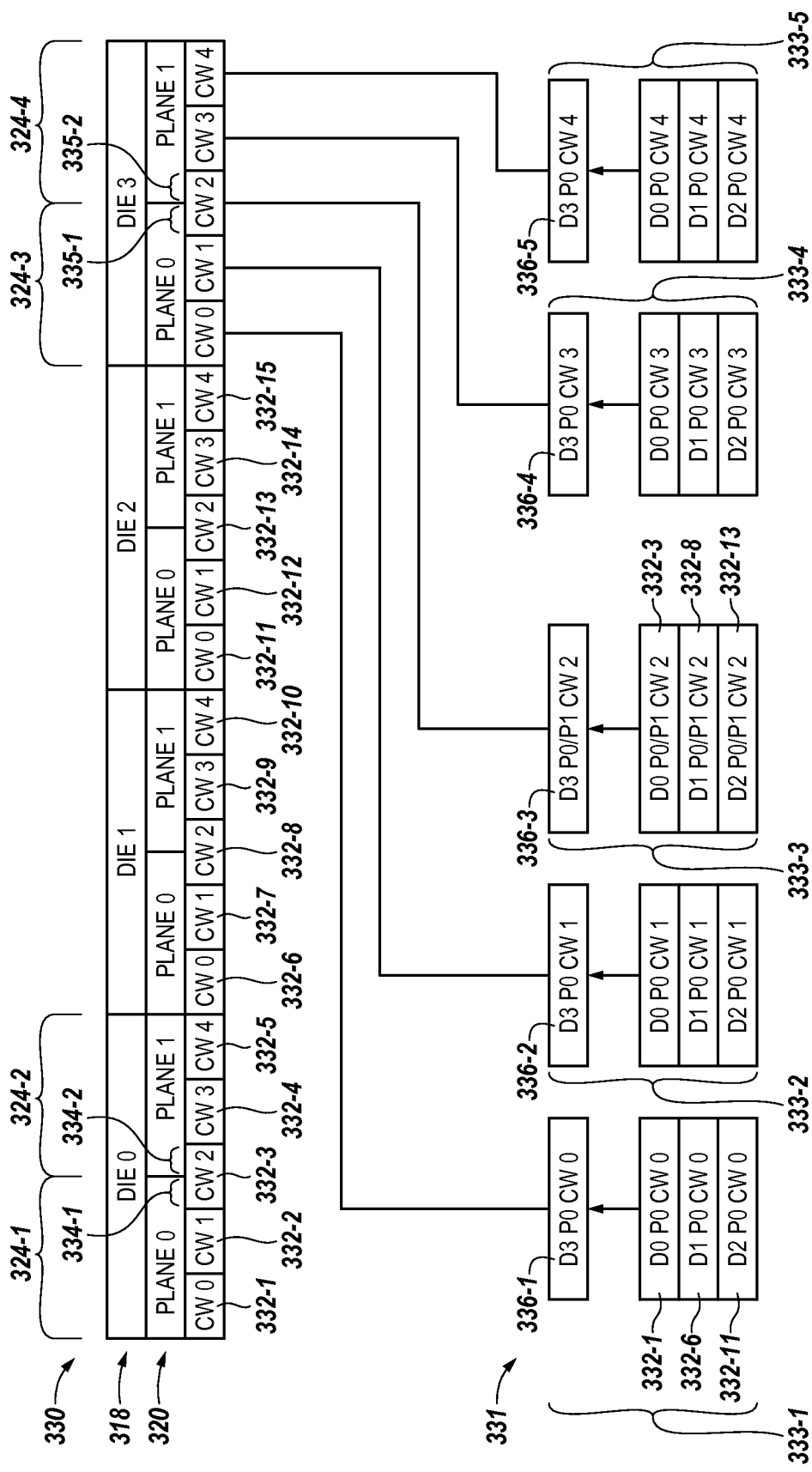
FIG. 3 illustrates a block diagram of a primary codeword layout and secondary codeword coding scheme in accordance with a number of embodiments of the present disclosure.

FIG. 3 illustrates a block diagram of a primary codeword layout 330 and secondary codeword coding scheme 331 in accordance with a number of embodiments of the present disclosure. The primary codeword layout 330 illustrates a correlation between a number of memory dice 318, a number of planes of memory 320, a number of primary codewords 332-1, 332-2, 332-3, 332-4, 332-5, 332-6, 332-7, 332-8, 332-9, 332-10, 332-11, 332-12, 332-13, 332-14, 332-15 (collectively primary codewords 332), and a number of secondary codewords 333-1, 333-2, 333-3, 333-4, 333-5 (collectively secondary codewords 333), according to a number of embodiments of the present disclosure. Embodiments are not limited to the numbers of dice 318, planes 320, primary codewords 332, or secondary codewords 333 illustrated in FIG. 3 as more or fewer of each (or different ratios between each) can be included in various embodiments of the present disclosure.

Data can be error coded as a number of primary codewords 332. The number of primary codewords 332 can be written to a number of physical pages of memory. For example, the codewords CW 0 332-1, CW 1 332-2, CW 2 332-3, CW 3 332-4, and CW 4 332-5 can be written to physical pages 324-1 and 324-2 in plane 0 and plane 1 respectively in memory die 0. Although not specifically labeled as such, each plane 320 (e.g., plane 0 and plane 1) can include different blocks of memory and different pages of memory. According to some previous approaches, an integer number of codewords were written to a single page of memory. However, according to a number of embodiments of the present disclosure, a first portion 334-1 of a primary codeword 332-3 (CW 2) can be written to a first page 324-1 in a first block of memory and a second portion 334-2 of the primary codeword 332-3 can be written to a second page 324-2 in a second block of memory. Spanning codewords across more than one page of memory can allow for flexibility in terms of code rate for differing page capacity while increasing an amount of the pages that are used (e.g., as opposed to leaving a portion of a page of memory unprogrammed because that portion was insufficiently large to store another whole codeword).

Data can be error coded as primary codewords 332 (e.g., prior to writing the primary codewords 332, or portions thereof, in memory). A primary codeword 332 can include a payload (e.g., user data that was error coded) and a wrapper (e.g., error data that protects the payload). Primary codewords 332 can be error coded as secondary codewords 333 as illustrated by the secondary codeword coding scheme 331. A secondary codeword 333 can include a number of primary codewords 332 and error data 336 that protects the primary codewords 332, which were coded as the secondary codeword 333. For example, secondary codeword 333-1 includes primary codewords 332-1 (D0 P0 CW0), 332-6 (D1 P0 CW0), and 332-11 (D2 P0 CW0) and error data 336-1 (D3 P0 CW0) that protects the primary codewords 332-1, 332-6, and 332-11. Each secondary codeword 333 can be coded based on more than one of the primary codewords 332. The error data 336 of the secondary codewords 333 can also be error coded analogously to the primary codewords 332 (e.g., with a payload made up of the error data that protects multiple primary codewords (as opposed to protecting user data) and a wrapper, such as error data that protects the payload of the secondary codeword) prior to being written in memory. For example, the error data 336-1 for the secondary codeword 333-1 can include a payload made up of error data that protects primary codewords 332-1 (D0 P0 CW0), 332-6 (D0 P0 CW0), and 332-11 (D0 P0 CW0), and that payload can be error coded as a primary codeword with a wrapper including error data that protects the payload of the error data 336-1.

The secondary codeword coding scheme 331 includes a representation of the primary codewords 332 and the secondary codewords 333 with their respective memory dice and planes of memory. For example, primary codeword 332-1 from die 0 and plane 0, which is represented as "CW 0" in the primary codeword layout 330, is represented as "D0 P0 CW0" in the secondary codeword coding scheme 331. Subsets of the primary codewords 332 can be included in secondary codewords 333. For example, the subset of primary codewords 332 including primary codewords 332-3 (D0 P0/P1 CW2), 332-8 (D1 P0/P1 CW2), and 332-13 (D2 P0/P1 CW2) that each span at least two pages and/or planes 320 and/or memory dice 318 can be error coded as a secondary codeword 333-3 including error data 336-3 (D3 P0/P1 CW2). The error data 336-3 can be written to at least two pages of memory 324-3, 324-4 such that the error data 336-3 for the secondary codeword 333-3 spans the at least two pages of memory 324-3, 324-4. A first portion 335-1 of the error data 336-3 is written in memory and a second portion 335-2 of the error data 336-3 is written to a different page and block of the memory than the first portion 335-1 of the error data 336-3. Other subsets of primary codewords 332 that do not span pages of memory can be included in respective secondary codewords 333 having error data 336 that also does not span pages of memory. For example, primary codewords 332-1 (D0 P0 CW0), 332-6 (D1 P0 CW0), and 332-11 (D2 P0 CW0), each of which are written to a respective single page of memory, a respective single block of memory, a respective single plane of memory, and/or a respective single memory die can be included in secondary codeword 333-1, which also includes error data 336-1 (D3 P0 CW0). The error data 336-1 can be written to a single page of memory, a single block of memory, a single plane of memory, and/or a single memory die.

Although FIG. 3 illustrates secondary codewords 333-1, 333-2, 333-4, 333-5 including error data 336-1, 336-2, 336-4, 336-5 that does not span pages of memory, which protect primary codewords 332 that do not span pages of memory and illustrates a secondary codeword 333-3 including error data 336-3 that spans pages of memory, which protects primary codewords that span pages of memory, embodiments are not so limited. For example, a secondary codeword 333-3 including error data 336-3 that spans pages of memory can be error coded based on primary codewords 332, some of which do not spans pages of memory (e.g., primary codeword 332-1) and some of which do span pages of memory (e.g., primary codeword 332-3) or based only on primary codewords 332 that do not span pages of memory. Likewise, a secondary codeword 333-1 including error data 336-1 that does not span pages of memory can be error coded based on primary codewords 332, some of which do not spans pages of memory (e.g., primary codeword 332-1) and some of which do span pages of memory (e.g., primary codeword 332-3) or based only on primary codewords 332 that do span pages of memory.

The controller (e.g., controller 108 illustrated in FIG. 1) can be configured to read a plurality of first pages of memory (e.g., page 324-1 and page 324-2) where the plurality of first pages of memory collectively include an integer number of primary codewords (e.g., primary codewords 332-1, 332-2, 332-3, 332-4, 332-5) and where each first page individually includes a non-integer number of primary codewords (e.g., page 324-1 includes primary codewords 332-1, 332-2, and a portion 334-1 of primary codeword 332-3). The controller can also be configured to read a plurality of second pages of memory (e.g., page 324-3 and page 324-4), where the plurality of second pages of memory collectively include an integer number of codewords comprising error data 336 for secondary codewords 333 (e.g., error data 336-1, 336-2, 336-3, 336-4, 336-5) and where each second page of memory individually includes a non-integer number of codewords comprising error data 336 for secondary codewords 333 (e.g., page 324-3 includes error data 336-1, 336-2, and a portion 335-1 of error data 336-3). The controller can be configured to recover one of the plurality of primary codewords based on a secondary codeword (a remainder of the plurality of primary codewords and error data for the secondary codeword). For example, primary codeword 332-1 can have a read error associated therewith that cannot be corrected by the error data associated with (e.g., included in the wrapper of) the primary codeword 332-1. The controller can be configured to recover the primary codeword 332-1, in such an instance, in response to the read error. In response to the read error that cannot be corrected with error data associated with only the primary codeword 332-1, the controller can be configured to read the plurality of second pages of memory (e.g., page 324-3 and page 324-4). More specifically, to recover the primary codeword 332-1, the controller can be configured to read pages storing primary codewords 332-6, 332-11 and the error data 336-1 for the secondary codeword 333-1. Primary codewords 332-6, 332-11, and error data 336-1 can be used to recover primary codeword 332-1 according to the secondary codeword coding scheme 331.

Although not specifically illustrated, a secondary codeword can be a mirror of a primary codeword. In some embodiments, for example, codewords 332-1, 332-2, 332-3, 332-4, and 332-5 can be primary codewords and codewords 332-6, 332-7, 332-8, 332-9, and 332-10 can be secondary codewords that mirror codewords 332-1, 332-2, 332-3, 332-4, and 332-5 respectively (e.g., where codeword 332-8 is a mirror of codeword 332-3, etc.). In such embodiments, some primary codewords may not span multiple pages of memory (e.g., codewords 332-1, 332-2, 332-4, and 332-5) while other primary codewords do span multiple pages of memory (e.g., codeword 332-3). In some embodiments a secondary codeword that is a mirror of a primary codeword may span multiple pages of memory if the primary codeword that is mirrored also spans multiple pages (e.g., primary codeword 332-3 and its mirrored secondary codeword 332-8 both span multiple pages of memory). In some embodiments, a primary codeword may span multiple pages of memory while its mirrored secondary codeword does not (e.g., primary codeword 332-3 spans multiple pages of memory while its mirrored secondary codeword 332-6 does not). In some embodiments, a primary codeword may not span multiple pages of memory while its mirrored secondary codeword does (e.g., primary codeword 332-1 does not span multiple pages of memory while its mirrored secondary codeword 332-8 does).

Although not specifically illustrated, in some embodiments primary codewords are not written to span multiple pages of memory while secondary codewords (or portions thereof) are written to span multiple pages of memory. In some embodiments, primary codewords are written to span multiple pages of memory while secondary codewords (or portions thereof) are not written to span multiple pages of memory.

Among other benefits of the present disclosure, primary codeword layout 330 and secondary codeword coding scheme 331 described herein can more efficiently utilize the available capacity of the memory by filling, or more closely filling, physical pages of memory with data by spanning codewords across physical pages as opposed to only writing an integer number of codewords in a physical page (e.g., the most full codewords that will fit in a physical page based on the size of the physical page and the size of the codewords). Furthermore, a number of embodiments of the present disclosure can provide an ability for a single controller design to efficiently operate different memory devices having different physical page sizes and different codeword sizes without otherwise altering or redesigning the controller. Such alterations or redesigns could include, for example, changing the code rate of an ECC component.

Figure 4:
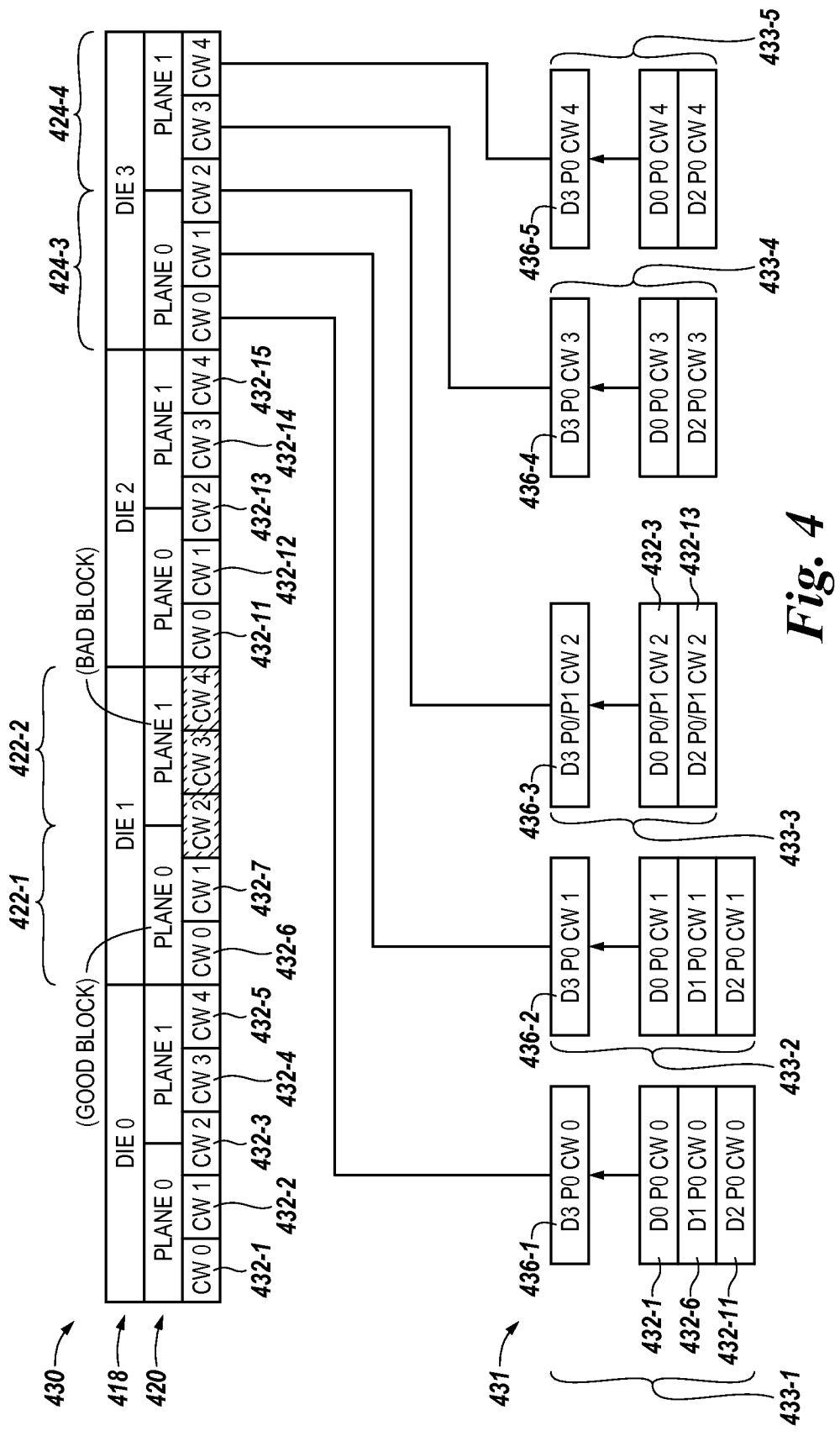
FIG. 4 illustrates a block diagram of a primary codeword layout and secondary codeword coding scheme in accordance with a number of embodiments of the present disclosure.

FIG. 4 illustrates a block diagram of a primary codeword layout 430 and secondary codeword coding scheme 431 in accordance with a number of embodiments of the present disclosure. The primary codeword layout 430 illustrates a correlation between a number of memory dice 418, a number of planes of memory 420, a number of primary codewords 432-1, 432-2, 432-3, 432-4, 432-5, 432-6, 432-7, 432-11, 432-12, 432-13, 432-14, 432-15 (collectively primary codewords 432), and a number of secondary codewords 433-1, 433-2, 433-3, 433-4, 433-5 (collectively secondary codewords 433), according to a number of embodiments of the present disclosure. Embodiments are not limited to the numbers of dice 418, planes 420, primary codewords 432, or secondary codewords 433 illustrated in FIG. 4 as more or fewer of each (or different ratios between each) can be included in various embodiments of the present disclosure.

The primary codeword layout 430 illustrated in FIG. 4 can be analogous to the primary codeword layout 330 illustrated in FIG. 3 with the exception of the portions of the primary codeword layout 430 associated with the indicated bad block 422-2 and the corresponding indicated good block 422-1, each of which may not have codewords written thereto according to a number of embodiments of the present disclosure.

A secondary codeword 433 can include a number of primary codewords 432 and error data 436 that protects the primary codewords 432, which were coded as the secondary codeword 433. For example, secondary codeword 433-1 includes primary codewords 432-1 (D0 P0 CW0), 432-6 (D1 P0 CW0), and 432-11 (D2 P0 CW0) and error data 436-1 (D3 P0 CW0) that protects the primary codewords 432-1, 432-6, and 432-11. Although FIG. 4 illustrates secondary codewords 433-1, 433-2, 433-4, 433-5 including error data 436-1, 436-2, 436-4, 436-5 that do not span pages of memory, which protect primary codewords 432 that do not span pages of memory and illustrates a secondary codeword 433-3 including error data 436-3 that spans pages of memory, which protects primary codewords that span pages of memory, embodiments are not so limited.

Some contrast between FIG. 3 and FIG. 4 may be helpful to understanding a number of embodiments of the present disclosure. With respect to FIG. 3, a first plurality of primary codewords 332-3 (D0 P0/P1 CW2), 332-8 (D1 P0/P1 CW2), 332-13 (D2 P0/P1 CW2) that each span at least two pages of memory, blocks of memory, planes of memory, and/or memory dice can be error coded as a first secondary codeword 333-3 including error data 336-3 (D3 P0/P1 CW2). With respect to FIG. 4, a second plurality of primary codewords 432-3 (D0 P0/P1 CW2), 432-13 (D2 P0/P1 CW2) that each span at least two pages of memory, blocks of memory, planes of memory, and/or memory dice can be error coded as a second secondary codeword 433-3 including error data 436-3 (D3 P0/P1 CW2), where the second plurality of primary codewords 432-3 (D0 P0/P1 CW2), 432-13 (D2 P0/P1 CW2) include fewer primary codewords than the first plurality of primary codewords 332-3 (D0 P0/P1 CW2), 332-8 (D1 P0/P1 CW2), 332-13 (D2 P0/P1 CW2) illustrated in FIG. 3 based on an indicated bad block of memory 422-2 illustrated in FIG. 4.

For example, the second plurality of primary codewords illustrated in FIG. 4 do not include all of the codewords associated with "Die 1" because of the indicated bad block of memory 422-2 contained therein. However, this does not mean that no codewords in "Die 1" can be used (e.g., CW0 and CW1 can be used). It is only codewords in blocks that are either indicated as bad blocks or blocks that correspond to indicated bad blocks that are not used.

With respect to FIG. 3, error data 336-3 (D3 P0/P1 CW2) associated with the first secondary codeword 333-3 can be written to span at least two pages of memory 324-3, 324-4. With respect to FIG. 4, error data 436-3 (D3 P0/P1 CW2) associated with the second secondary codeword 433-3 can be written to span at least two pages of memory 424-3, 424-4. In a number of embodiments, the first plurality of primary codewords 332-3 (D0 P0/P1 CW2), 332-8 (D1 P0/P1 CW2), 332-13 (D2 P0/P1 CW2) and the error data 336-3 (D3 P0/P1 CW2) associated with the first secondary codeword 333-3 can be written as a RAIN stripe, where a payload of the error data 336-3 (D3 P0/P1 CW2) comprises parity data protecting the first plurality of primary codewords 332-3 (D0 P0/P1 CW2), 332-8 (D1 P0/P1 CW2), 332-13 (D2 P0/P1 CW2). In a number of embodiments, the second plurality of primary codewords 432-3 (D0 P0/P1 CW2), 432-13 (D2 P0/P1 CW2) and the error data 436-3 (D3 P0/P1 CW2) associated with the second secondary codeword can be a written as a RAIN stripe, where a payload of the error data 436-3 (D3 P0/P1 CW2) comprises parity data protecting the second plurality of primary codewords 432-3 (D0 P0/P1 CW2), 432-13 (D2 P0/P1 CW2).

A subset of the plurality of primary codewords (e.g., primary codewords 432-3, 432-13) can be written so as to span at least two pages of memory. However, the controller can be configured not to write a portion one of the subset of the plurality of primary codewords (e.g., codeword CW2 illustrated in "Die 1") to a portion of a first page of memory in an indicated good block 422-1 in response to a corresponding second page of memory being in an indicated bad block 422-2. Rather, any information written in the area marked as "CW2" in "Plane 0" "Die 1" in FIG. 4 can be fill data that is not coded as part of the secondary codeword 436-3 (or any other secondary codeword). The one of the subset of the plurality of primary codewords (e.g., codeword CW2 illustrated in "Die 1") would otherwise span the first page of memory and the second page of memory if the second page of memory were in an indicated good block of memory (e.g., as illustrated for primary codeword 332-8 illustrated in "Die 1" in FIG. 3). In a number of embodiments, a block of memory that is indicated to be a good block of memory (e.g., block 422-1) may not have portions of spanning primary codewords (e.g., CW2) written thereto in response to a corresponding block of memory (e.g., block 422-2) being indicated as a bad block of memory in a block table.

Embodiments are not limited to the primary codewords 432-1, 432-2, 432-3, 432-4, 432-5, 432-6, 432-7, 432-11, 432-12, 432-13, 432-14, 432-15 being written in a sequential order (with the exception that primary codewords within one physical page of memory are generally written at one time according to a page programming operation). However, in a number of embodiments, the primary codewords 432 can be written sequentially. The controller (e.g., controller 108 illustrated in FIG. 1) can be configured to write a particular primary codeword (e.g., primary codeword 332-8 illustrated in FIG. 3) to span at least two particular pages of memory in response to the block table (e.g., block table 116 illustrated in FIG. 1) indicating that the particular pages of memory are in a number of good blocks of memory. The controller can be configured not to write the particular primary codeword to span the at least two particular pages of memory in response to the block table indicating that at least one of the particular pages of memory is in a number of bad blocks of memory (e.g. as illustrated for block 422-2 in FIG. 4.

The secondary codeword coding scheme 431 illustrated in FIG. 4 can be analogous to the secondary codeword coding scheme 331 illustrated in FIG. 3 with the exception that the secondary codewords 433 are error coded, in some instances, based on fewer (e.g., two or three) primary codewords 432 (rather than three primary codewords 332 in FIG. 3) in response to the presence of the indicated bad block 422-2. Embodiments are not limited to the specific examples of numbers of primary codewords that form the basis of secondary codewords illustrated in FIG. 3 and FIG. 4. Secondary codewords can be error coded based on more or fewer primary codewords than is illustrated with one or more primary codewords containing error data based on the secondary coding scheme.

Conclusion

The present disclosure includes apparatuses and methods for codewords that span pages of memory. A number of methods include writing a first portion of a primary codeword to a first page in a first block of memory and writing a second portion of the primary codeword to a second page in a second block of memory. The primary codeword can be included in a secondary codeword. The method can include writing a first portion of the secondary codeword in the memory and writing a second portion of the secondary codeword to a different page and block of the memory than the first portion of the secondary codeword.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   writing:
      a first portion of a first primary codeword to a first page in a first block of memory;
      a second portion of the first primary codeword to a second page in a second block of memory; and
      a first portion and a second portion of a second primary codeword to the first page in the first block of memory;
   including the first primary codeword in a first secondary codeword and the second primary codeword in a second secondary codeword;
   testing a number of blocks including the first block and the second block; and
   when the first block of memory and the second block of memory are good blocks of memory, writing:
      a first portion of the first secondary codeword in the memory; and
      a second portion of the first secondary codeword to a different page and block of the memory than the first portion of the first secondary codeword; and
      a first portion and a second portion of the second secondary codeword in the memory; and
   when the second block of memory is a bad block of memory:
      writing neither the first portion nor the second portion of the first secondary codeword to the memory; and
      writing the first portion and the second portion of the second secondary codeword to the memory.

2. The method of claim 1, wherein including the first primary codeword in the first secondary codeword comprises mirroring the first primary codeword as the first secondary codeword.

3. The method of claim 1, wherein including the first primary codeword in the first secondary codeword comprises error coding the first primary codeword and at least one other primary codeword as the first secondary codeword.

4. The method of claim 3, wherein the method comprises calculating error data based on the first primary codeword and the at least one other primary codeword; and
   wherein the first and the second portion of the first secondary codeword comprise the error data.

5. The method of claim 1, wherein writing the first portion of the first secondary codeword comprises writing the first portion of the first secondary codeword to a third page in a third block of memory; and
   wherein writing the second portion of the first secondary codeword comprises writing the second portion of the first secondary codeword to a fourth page in a fourth block of memory.

6. The method of claim 1, wherein the method comprises:
   error coding data comprising the first primary codeword prior to writing the first and the second portions of the first primary codeword; and
   error coding at least a portion of the first secondary codeword as a second primary codeword comprising the first and the second portions of the first secondary codeword.

7. The method of claim 6, wherein error coding data comprising the first primary codeword comprises one or more of the group including:
   cyclic redundancy check (CRC) coding;
   Bose-Chaudhuri-Hocquenghem (BCH) coding; and
   low density parity check (LDPC) coding; and wherein the method comprises error coding the primary codeword and at least one other primary codeword as the secondary codeword using one of the group of coding schemes including:
performing an exclusive or (XOR) operation on the primary codeword and the at least one other primary codeword;
Reed-Solomon error coding; and
BCH coding.

8. A method, comprising:
error coding data as a plurality of primary codewords;
writing a first group of primary codewords of the plurality of primary codewords to a plurality of pages of memory such that the first group of primary codewords each span at least two of the plurality of pages of the memory;
writing a second group of primary codewords of the plurality of primary codewords to one of the at least two of the plurality of pages of the memory;
error coding;
at least one of the first group of the plurality of primary codewords as a first secondary codeword; and
at least one of the second group of primary codewords as a second secondary codeword;
wherein the error coding includes:
writing the second secondary codeword when the one of the at least two of the plurality of pages the second group of primary codewords is written to is in a good block of memory;
not writing the second secondary codeword when the one of the at least two of the plurality of pages is in a bad block of memory;
not writing the first secondary codeword when one of the at least two of the plurality of pages the first group of primary codewords is written on is in an indicated good block of memory and an other one of the at least two of the plurality of pages the first group of primary codewords is written on is in an indicated bad block of memory; and
writing the first secondary codeword when the at least two of the plurality of pages are written in two good blocks of memory.

9. The method of claim 8, wherein:
error coding the at least one of the first group of the plurality of primary codewords comprises mirroring one of the first group of the plurality of primary codewords as the first secondary codeword; and
writing an entirety of the first secondary codeword to span at least two pages of memory.

10. The method of claim 9, wherein writing the first secondary codeword to span the at least two pages of memory comprises writing the first secondary codeword to one page of memory in each of at least two different blocks of memory.

11. The method of claim 9, wherein writing the first secondary codeword to span the at least two pages of memory comprises writing the first secondary codeword to one respective page of memory in each of at least two different memory dice.

12. A method, comprising:
error coding data as a plurality of primary codewords;
writing the plurality of primary codewords to a plurality of pages of memory;
error coding a first secondary codeword based on at least one of the plurality of primary codewords;
error coding a second secondary codeword based on at least one of the plurality of primary codewords;
writing at least a portion of the first secondary codewords to at least two pages of memory such that the portion of the first secondary codewords spans the at least two pages of memory, wherein the at least two pages of memory are in good blocks of memory; and
not writing a first portion of the second secondary codeword to a portion of a first page of memory when the corresponding first portion of the corresponding at least one of the plurality of primary codewords is in an indicated good block of memory and a corresponding second portion of the corresponding at least one of the plurality of primary codewords is in a page of memory in an indicated bad block of memory, wherein a second portion of the second secondary codeword would be written to the second page of memory if the second page of memory of the corresponding at least one of the plurality of primary codewords were in an indicated good block of memory.

13. The method of claim 12, wherein the first portion and the second portion of the secondary codeword comprise parity data for the secondary codeword.

14. The method of claim 12, wherein the first portion and the second portion of the secondary codeword collectively comprise a mirrored primary codeword.

15. The method of claim 12, wherein writing the plurality of primary codewords to a plurality of pages of memory comprises writing the plurality of primary codewords such that each of the plurality of primary codewords do not span a page of memory.

16. The method of claim 12, wherein writing the plurality of primary codewords to a plurality of pages of memory comprises writing the plurality of primary codewords such that a subset of the plurality of primary codewords each span at least two of the plurality of pages of memory.

17. The method of claim 12, wherein writing the portion of the first secondary codeword to the at least two pages of memory comprises writing the portion of the first secondary codeword in each of a first and a second block of memory; and
wherein the first block of memory does not comprise a first particular block of memory that is indicated to be a good block of memory in a block table in response to a second particular block of memory corresponding to the first particular block of memory being indicated as a bad block of memory in the block table.

18. An apparatus, comprising:
a plurality of memory devices; and
a controller coupled to the plurality of memory devices and configured to:
maintain a correspondence between first pages of memory and second pages of memory in each of a plurality of pairs of blocks of memory, wherein each of the plurality of pairs of blocks of memory includes a first block of memory including a respective first page of memory and a second block of memory including a respective second page of memory; and
prevent writing of a portion of a first codeword to a particular first page of memory that is in an indicated good block of memory in response to a corresponding second page of memory being in an indicated bad block of memory; and
writing a second codeword to the first page of memory.

19. The apparatus of claim 18, wherein the controller is configured to write the portion of the codeword to the particular first page of memory and a second portion of the codeword to the corresponding second page of memory in response to the first page being in an indicated good block of memory and in response to the corresponding second page being in an indicated good block of memory.

20. The apparatus of claim 18, wherein the codeword comprises a primary codeword, and wherein the controller is configured to:
   write a plurality of primary codewords, each to a respective first and corresponding second page of memory;
   error code the plurality of primary codewords as a secondary codeword; and
   write at least a portion of the secondary codeword to a portion of a third page of memory and a portion of a fourth page of memory.

21. The apparatus of claim 20, wherein the controller is configured to recover one of the plurality of primary codewords that is subject to an uncorrectable error based on a remainder of the plurality of codewords and the portion of the secondary codeword, which comprises error data fro the secondary codeword.

22. The apparatus of claim 20, wherein the at least a portion of the secondary codeword comprises and entirety of the secondary codeword, which comprises a mirrored primary codeword.

23. The apparatus of claim 18, wherein each of the plurality of pairs of blocks of memory is on a different memory die.

24. An apparatus, comprising:
   a plurality of memory devices; and
   a controller coupled to the plurality of memory devices and configured to:
      read a plurality of first pages of memory, wherein the plurality of first pages of memory collectively include an integer number of primary codewords, and wherein each first page of memory individually includes a non-integer number of primary codewords, wherein when a non-integer portion of a primary codeword of the number of primary codewords is in a bad block of memory all portions of the primary codeword are not written to memory;
      read a second page of memory, wherein the second page of memory includes at least a portion of a secondary codeword; and
      recover one of the integer number of primary codewords based on the secondary codeword.

25. The apparatus of claim 24, wherein the controller is configured to recover the one of the integer number of primary codewords in response to a read error associated with the one of the integer number of primary codewords that cannot be corrected by error data associated only with the one of the integer number of primary codewords.

26. The apparatus of claim 24, wherein the integer number of primary codewords each include user data and error data that is associated exclusively therewith; and
   wherein the portion of the secondary codeword comprises parity data for the secondary codeword calculated based on more than one of the integer number of primary codewords.

27. The apparatus of claim 24, wherein the at least a portion of the secondary codeword comprises an entirety of the secondary codeword, and wherein the secondary codeword comprises a mirror of the one of the integer number of primary codewords.

28. An apparatus, comprising:
   a plurality of memory devices;
   a secondary error control coding (ECC) component configured to:
      error code a first plurality of primary codewords that each span at least two pages of memory as a first secondary codeword; and
      error code a second plurality of primary codewords that each span at least two pages of memory as a second secondary codeword, wherein the second plurality of primary codewords include fewer primary codewords than the first plurality of primary codewords based on an indicated bad block of memory;
   a controller coupled to the secondary ECC component and to the plurality of memory devices and configured to:
      write at least a portion of the first secondary codeword to span at least two pages of memory; and
      write at least a portion of the second secondary codeword to span at least two pages of memory;
   wherein, when:
      a first primary codeword of the first plurality of primary codewords is written to a first page and a second page of the memory;
      a second primary codeword of the second plurality of primary codewords is written to the second page and a third page of the memory; and
      the third page is in a bad block of memory;
   the error-coded second primary codeword is not written to either of the second page and the third page while the error-coded first primary codeword is written to both the first page and the second page.

29. The apparatus of claim 28, wherein the controller is configured to:
   write each of the first plurality of primary codewords to a different one of the plurality of memory devices; and
   write each of the second plurality of primary codewords to a different one of the plurality of memory devices.

30. The apparatus of claim 28, wherein each of the first plurality of primary codewords spans at least two planes of memory; and
   wherein each of the second plurality of primary codewords spans at least two planes of memory.

31. The apparatus of claim 28, wherein the apparatus includes a block table; and
   wherein the controller is configured to:
      maintain the block table to include an indication of whether each block of memory is a bad block of memory;
      write a particular primary codeword to span at least two particular pages of memory in response to the block table indicating that the at least two particular pages of memory are in a number of good blocks of memory; and
      not write the particular primary codeword to span the at least two particular pages of memory in response to the block table indicating that either of the at least two particular pages of memory is in a bad block of memory.

32. The apparatus of claim 28, wherein the controller is configured to:
   write the first plurality of primary codewords and the portion of the first secondary codeword as a first redundant array of independent nodes (RAIN) stripe; and
   write the second plurality of primary codewords and the portion of the second secondary codeword as a second RAIN stripe.

33. The apparatus of claim 28, wherein the apparatus includes a primary ECC component configured to error code data with a fixed primary codeword size; and
   wherein the plurality of memory devices have a fixed page size that is not evenly divisible by the fixed primary codeword size.

34. The apparatus of claim 33, wherein the primary and the secondary ECC components are part of the controller.

35. The apparatus of claim 33, wherein at least one of the primary and the secondary ECC components are separate from the controller.

* * * * *